US012796188B2

(12) United States Patent
Murata et al.

(10) Patent No.: US 12,796,188 B2
(45) Date of Patent: Nov. 10, 2026

(54) LIGHT-EMITTING DEVICE

(71) Applicant: NICHIA CORPORATION, Anan (JP)

(72) Inventors: Yoshiaki Murata, Komatsushima (JP); Takehiro Nishimori, Anan (JP)

(73) Assignee: NICHIA CORPORATION, Anan (JP)

( * ) Notice: Subject to any disclaimer, the term of this patent is extended or adjusted under 35 U.S.C. 154(b) by 337 days.

(21) Appl. No.: 18/656,561

(22) Filed: May 6, 2024

(65) Prior Publication Data

US 2024/0379916 A1 Nov. 14, 2024

(30) Foreign Application Priority Data

May 10, 2023 (JP) ................................ 2023-077678

(51) Int. Cl.

*H10H 20/853* (2025.01)
*H10H 20/80* (2025.01)
*H10H 20/841* (2025.01)
*H10H 20/854* (2025.01)
*H10H 20/856* (2025.01)
*H10H 20/857* (2025.01)
*H10W 90/00* (2026.01)

(52) U.S. Cl.

CPC ........ *H10H 20/853* (2025.01); *H10H 20/854* (2025.01); *H10H 20/856* (2025.01); *H10H 20/882* (2025.01); *H10W 90/00* (2026.01); *H10H 20/841* (2025.01); *H10H 20/857* (2025.01)

(58) Field of Classification Search

None

See application file for complete search history.

(56) References Cited

U.S. PATENT DOCUMENTS

2016/0190106 A1 6/2016 Takagi et al.
2020/0006608 A1* 1/2020 Ozeki ................ H10H 20/8506
2020/0168776 A1* 5/2020 Ukawa ................. H10H 20/814
2020/0313058 A1 10/2020 Ukawa et al.

FOREIGN PATENT DOCUMENTS

CN 112038463 A 12/2020
CN 112563383 A 3/2021
JP 2014-093311 A 5/2014

(Continued)

*Primary Examiner* — Julio J Maldonado
*Assistant Examiner* — Pinaki Das
(74) *Attorney, Agent, or Firm* — Spencer Fane LLP

(57) ABSTRACT

A light-emitting device includes first and second light-emitting elements and first and second covering members respectively containing first and second reflective particles. The first covering member includes a first reflective portion and a first light-transmissive portion. A ratio of an area of the first reflective particles to an area of the first reflective portion is higher than a ratio of an area of the second reflective particles to an area of the second covering member. A ratio of the area of the first reflective particles to an area of the first light-transmissive portion is lower than the ratio of the area of the second reflective particles to the area of the second covering member in the first cross section. A minimum height of the first light-transmissive portion between the first and second light-emitting elements is greater than that of the first light-transmissive portion outward of the first light-emitting element.

8 Claims, 12 Drawing Sheets

(56) References Cited

FOREIGN PATENT DOCUMENTS

| | | | |
|---|---|---|---|
| JP | 2016-072412 | A | 5/2016 |
| JP | 2016-127059 | A | 7/2016 |
| JP | 2020-010013 | A | 1/2020 |
| JP | 2020-092251 | A | 6/2020 |
| JP | 2020-170737 | A | 10/2020 |

* cited by examiner

LIGHT-EMITTING DEVICE

CROSS-REFERENCE TO RELATED APPLICATIONS

The present application claims priority under 35 U.S.C. § 119 to Japanese Patent Application No. 2023-077678, filed May 10, 2023, the content of which is hereby incorporated herein by reference in its entirety.

1. TECHNICAL FIELD

Embodiments according to the present invention relate to a light-emitting device.

2. DESCRIPTION OF RELATED ART

Light-emitting devices employing light-emitting elements such as LEDs easily provide high luminous efficacy and are therefore used in a wide field of lighting, vehicle lighting, displays, backlights of liquid-crystal displays, and the like. Japanese Unexamined Patent Application Publication No. 2016-127059 discloses a light-emitting device including three light-emitting elements having different emission colors.

SUMMARY

Further improvement in color mixing properties of light-emitting devices is demanded. An object of an embodiment of the present disclosure is to provide a light-emitting device that can provide improved color mixing properties.

According to one embodiment of the present disclosure, a light-emitting device includes a support, a first light-emitting element, a second light-emitting element, a first covering member, and a second covering member. The support has a first surface. The first light-emitting element is located on the first surface and configured to emit light with a first peak wavelength. The second light-emitting element is located on the first surface and configured to emit light with a second peak wavelength different from the first peak wavelength. The first covering member exposes at least a portion of an upper surface of the first light-emitting element and at least a portion of an upper surface of the second light-emitting element, covers at least a portion of a lateral surface of the first light-emitting element and at least a portion of a lateral surface of the second light-emitting element, and contains a plurality of first reflective particles. The second covering member covers at least a portion of the upper surface of the first light-emitting element and at least a portion of the upper surface of the second light-emitting element and contains a plurality of second reflective particles. The first covering member includes a first reflective portion and a first light-transmissive portion above the first reflective portion in a first cross section passing through the first light-emitting element and the second light-emitting element and lying in a plane perpendicular to the first surface. A ratio of an area of the plurality of first reflective particles to an area of the first reflective portion is higher than a ratio of an area of the plurality of second reflective particles to an area of the second covering member in the first cross section. A ratio of the area of the plurality of first reflective particles to an area of the first light-transmissive portion is lower than the ratio of the area of the plurality of second reflective particles to the area of the second covering member in the first cross section. A minimum height of the first light-transmissive portion located between the first light-emitting element and the second light-emitting element is greater than a minimum height of the first light-transmissive portion located outward of the first light-emitting element in the first cross section.

The light-emitting device of one embodiment of the present disclosure allows for improving color mixing properties.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DETAILED DESCRIPTION OF EMBODIMENTS

Figure 1:
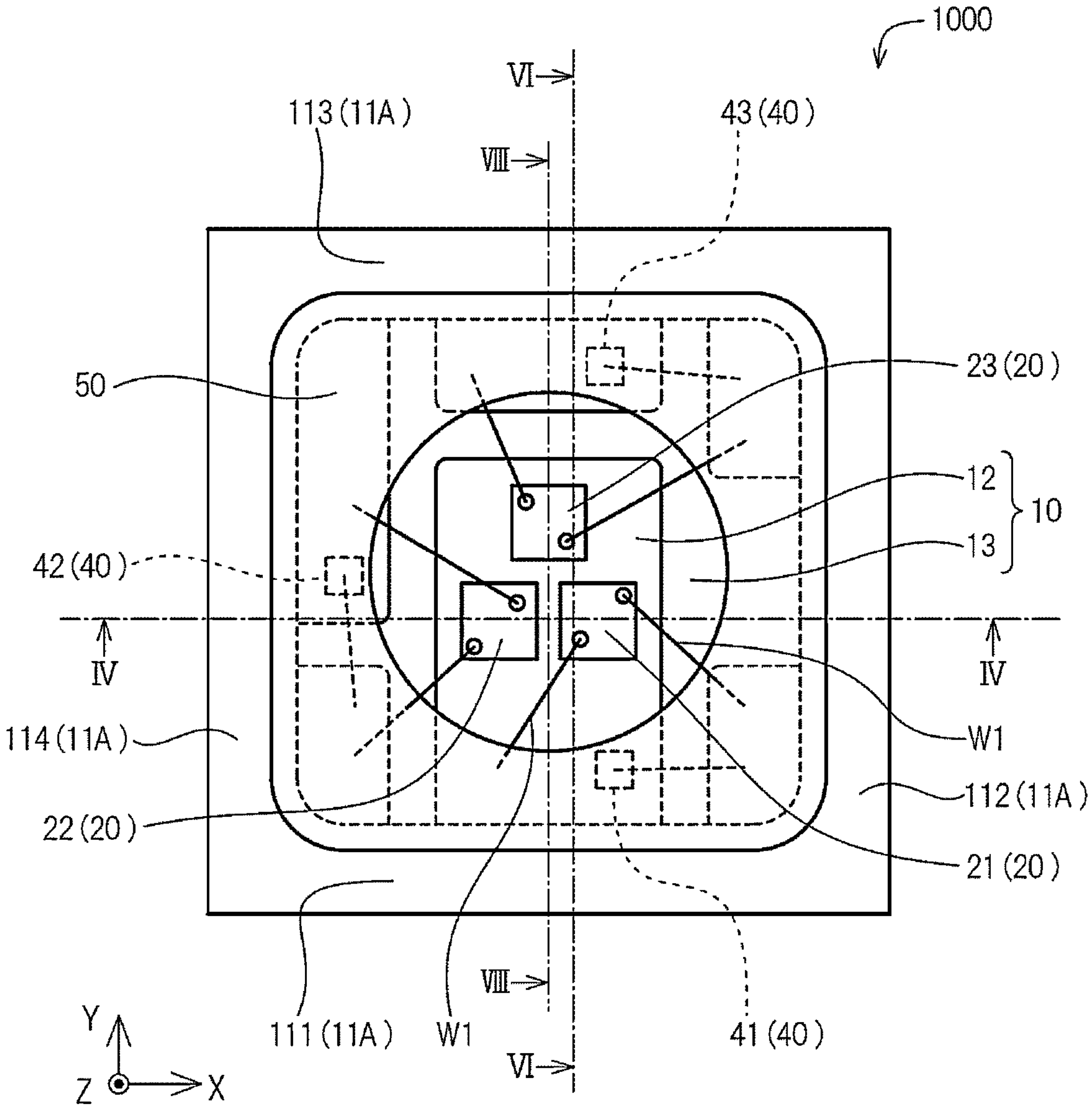
FIG. 1 is a schematic top view of a light-emitting device according to the present embodiment.

Certain embodiments will be described below with reference to the accompanying drawings. Each drawing schematically shows an embodiment. The scales, distances, positional relationships, and the like of members may therefore be exaggerated, or illustration of portions of members may be omitted. In the present specification, the direction of the arrow of the Z-axis is referred to as the upward direction, and the direction opposite to the direction of the arrow of the Z-axis is referred to as the downward direction. A view of an object from above is referred to as a top view, and a top view is synonymous with a plan view. Also, cross-sectional end views showing only cut surfaces of members may be used as cross-sectional views.

In the description below, components having substantially the same function will be shown with the same reference numerals, and repeated descriptions of such components may be omitted. Terms representing particular directions or positions (such as "up/upper," "down/lower," and other terms containing the meanings of these terms) may be used. These terms are used merely for the sake of ease of explanation, representing relative directions or relative positions in the reference drawings. As far as the relative directions or positions mentioned by the terms "upper," "lower," and the like designate the same directions or positions in the reference drawings, drawings other than shown in the present disclosure, actual products, and the like do not have to be the same arrangement as shown in the reference drawings. The term "parallel" in the present specification indicates not only the case in which two straight lines, sides, surfaces, or the like do not intersect even when extended but also the case in which two straight lines, sides, surfaces, or the like intersect to form an angle within the range of 10° or less. The positional relationship represented as "on" in the present specification includes both the case in which components are in contact with each other and the case in which a component is not in contact with but is located above another component.

Embodiment

A light-emitting device 1000 of an embodiment will be described with reference to FIG. 1 to FIG. 12. In FIGS. 1-3, and 12, a first covering member 31 and a second covering member 32 is omitted to show the internal construction.

The light-emitting device 1000 includes a support 10, light-emitting elements 20, a first covering member 31, and a second covering member 32. The support 10 has a first surface 101. The light-emitting elements 20 include a first light-emitting element 21 and a second light-emitting element 22. The first light-emitting element 21 is located on the first surface 101 of the support 10. The first light-emitting element 21 emits light with a first peak wavelength. The second light-emitting element 22 is located on the first surface 101 of the support 10. The second light-emitting element 22 emits light with a second peak wavelength different from the first peak wavelength. The first covering member 31 covers at least a portion of a lateral surface of the first light-emitting element 21 and at least a portion of a lateral surface of the second light-emitting element 22 such that at least a portion of an upper surface of the first light-emitting element 21 and at least a portion of an upper surface of the second light-emitting element 22 are exposed. The first covering member 31 contains a plurality of first reflective particles 310A. The second covering member 32 covers at least a portion of an upper surface 21A of the first light-emitting element 21 and at least a portion of the upper surface of the second light-emitting element 22. The second covering member 32 contains a plurality of second reflective particles 320A. A first cross section is a cross section passing through the first light-emitting element 21 and the second light-emitting element 22 and lying in a plane perpendicular to the first surface 101. In the first cross section, the first covering member 31 includes a first reflective portion 311A and a first light-transmissive portion 311B. The first light-transmissive portion 311B is located above the first reflective portion 311A. In the first cross section, the ratio of the area of the first reflective particles 310A to the area of the first reflective portion 311A is higher than the ratio of the area of the second reflective particles 320A to the area of the second covering member 32. In the first cross section, the ratio of the area of the first reflective particles 310A to the area of the first light-transmissive portion 311B is lower than the ratio of the area of the second reflective particles 320A to the area of the second covering member 32. In the first cross section, the minimum height of the first light-transmissive portion 311B located between the first light-emitting element and the second light-emitting element is greater than the minimum height of the first light-transmissive portion 311B located outward of the first light-emitting element 21. In the present specification, the term "the height of each member" refers to the length from the first surface of the support to the upper surface of the member in the upper-lower direction (Z direction). The minimum height of each member refers to the minimum length from the first surface of the support to the upper surface of the member in the upper-lower direction (Z direction). The maximum height of each member refers to the maximum length from the first surface of the support to the upper surface of the member in the upper-lower direction (Z direction).

In the first cross section, the ratio of the area of the first reflective particles 310A to the area of the first light-transmissive portion 311B is lower than the ratio of the area of the second reflective particles 320A to the area of the second covering member 32, so that it is easy to improve the transmittance of the first light-transmissive portion 311B. The minimum height of the first light-transmissive portion 311B located between the first light-emitting element and the second light-emitting element is greater than the minimum height of the first light-transmissive portion 311B located outward of the first light-emitting element 21, so that it is easy to guide light emitted from the first light-emitting element 21 and light emitted from the second light-emitting element 22 through the first light-transmissive portion 311B located between the first light-emitting element and the second light-emitting element. The light emitted from the first light-emitting element 21 and the light emitted from the second light-emitting element 22 are thus easily mixed inside the first light-transmissive portion 311B, so that the color mixing properties of the light-emitting device 1000 are improved.

Components constituting the light-emitting device 1000 will be described below in detail.

Light-Emitting Element 20

As shown in FIG. 1, the light-emitting device 1000 includes a plurality of light-emitting elements 20. In the present embodiment, the light-emitting device 1000 includes the first light-emitting element 21, the second light-emitting element 22, and a third light-emitting element 23. The number of the light-emitting elements 20 included in the light-emitting device 1000 may be one, two, three, or four or more.

The light-emitting element 20 includes a semiconductor layered body. For example, the semiconductor layered body includes a substrate such as a sapphire or gallium nitride substrate, an n-type semiconductor layer and a p-type semiconductor layer disposed on the substrate, and a light-emitting layer between the n-type semiconductor layer and the p-type semiconductor layer. The light-emitting element 20 also includes an n-side electrode electrically connected to the n-type semiconductor layer and a p-side electrode electrically connected to the p-type semiconductor layer. The n-side electrode and the p-side electrode constitute portions of the lower surface of the light-emitting element 20. The light-emitting element 20 may not include a substrate such as a sapphire or gallium nitride substrate. This constitution facilitates miniaturization of the light-emitting element 20.

The light-emitting layer may have a structure with a single active layer, such as a double heterostructure and a single quantum well (SQW) structure, or a structure with a group of active layers, such as a multiple quantum well (MQW) structure. The light-emitting layer is configured to emit visible light or ultraviolet light. The light-emitting layer is configured to emit blue to red light as the visible light. The semiconductor layered body including such a light-emitting layer can contain, for example, $In_xAl_yGa_{1-x-y}N$ ($0 \leq x$, $0 \leq y$, and $x+y \leq 1$). The semiconductor layered body can include at least one light-emitting layer adapted to emit the above-described light. For example, the semiconductor layered body may include one or more light-emitting layers between the n-type semiconductor layer and the p-type semiconductor layer or may have a structure in which the n-type semiconductor layer, the light-emitting layer, and the p-type semiconductor layer layered in order are repeated. In the case in which the semiconductor layered body includes a plurality of light-emitting layers, the semiconductor layered body may include light-emitting layers with different peak wavelengths or light-emitting layers with the same peak wavelength. The expression "same peak wavelength" allows for, for example, variations of approximately several nanometers. Such a combination of light-emitting layers can be appropriately selected, and in the case in which the semiconductor layered body includes two light-emitting layers, for example, the combination of light-emitting layers can be selected from blue light and blue light, green light and green light, red light and red light, ultraviolet light and ultraviolet light, blue light and green light, blue light and red light, and green light and red light. The light-emitting layers may include a plurality of active layers configured to emit different peak wavelengths or a plurality of active layers configured to emit the same peak wavelength.

The first light-emitting element 21 emits light with the first peak wavelength. A wavelength at which the output value is highest in an optical spectrum of light emitted from the first light-emitting element 21 is referred to as the first peak wavelength. For example, the first peak wavelength is 430 nm or more and 480 nm or less. The first light-emitting element 21 of the present embodiment emits blue light. The first light-emitting element 21 may emit green light, red light, or the like.

The second light-emitting element 22 emits light with the second peak wavelength different from the first peak wavelength. A wavelength at which the output value is highest in an optical spectrum of light emitted from the second light-emitting element 22 is referred to as the second peak wavelength. For example, the second peak wavelength is 500 nm or more and 580 nm or less. The second light-emitting element 22 of the present embodiment emits green light. The second light-emitting element 22 may emit blue light, red light, or the like.

The third light-emitting element 23 emits light with a third peak wavelength different from the first peak wavelength and the second peak wavelength. A wavelength at which the output value is highest in an optical spectrum of light emitted from the third light-emitting element 23 is referred to as the third peak wavelength. For example, the third peak wavelength is 600 nm or more and 780 nm or less. The third light-emitting element 23 of the present embodiment emits red light. The third light-emitting element 23 may emit blue light, green light, or the like. For example, the first light-emitting element 21 emits blue light, the second light-emitting element 22 emits green light, and the third light-emitting element 23 emits red light, so that the light-emitting device 1000 can emit light of full color, which facilitates improvement in color reproducibility.

In the present embodiment, as shown in FIG. 1, the first light-emitting element 21 and the second light-emitting element 22 are aligned in a first direction. In the present specification, the expression "the first light-emitting element 21 and the second light-emitting element 22 are aligned in the first direction" means that at least a portion of each of the first light-emitting element 21 and the second light-emitting element 22 is located on a straight line along the first direction. In FIG. 1, the first direction is an X direction. A direction orthogonal to the first direction is defined as a second direction. In FIG. 1, the second direction is a Y direction. The direction orthogonal to the first direction and the second direction is defined as a third direction. In FIG. 1, the third direction is the Z direction.

In a top view, at least a portion of a lateral surface of the first light-emitting element 21 and at least a portion of a lateral surface of the second light-emitting element 22 facing each other are preferably parallel to each other. This constitution is likely to make the length from the lateral surface of the first light-emitting element 21 to the lateral surface of the second light-emitting element 22 constant, so that reduction of the unevenness in color of the light-emitting device 1000 is facilitated. In the present embodiment, as shown in FIG. 1, the lateral surface of the first light-emitting element 21 and the lateral surface of the second light-emitting element 22 facing each other extend in the second direction (Y direction).

Figure 2:
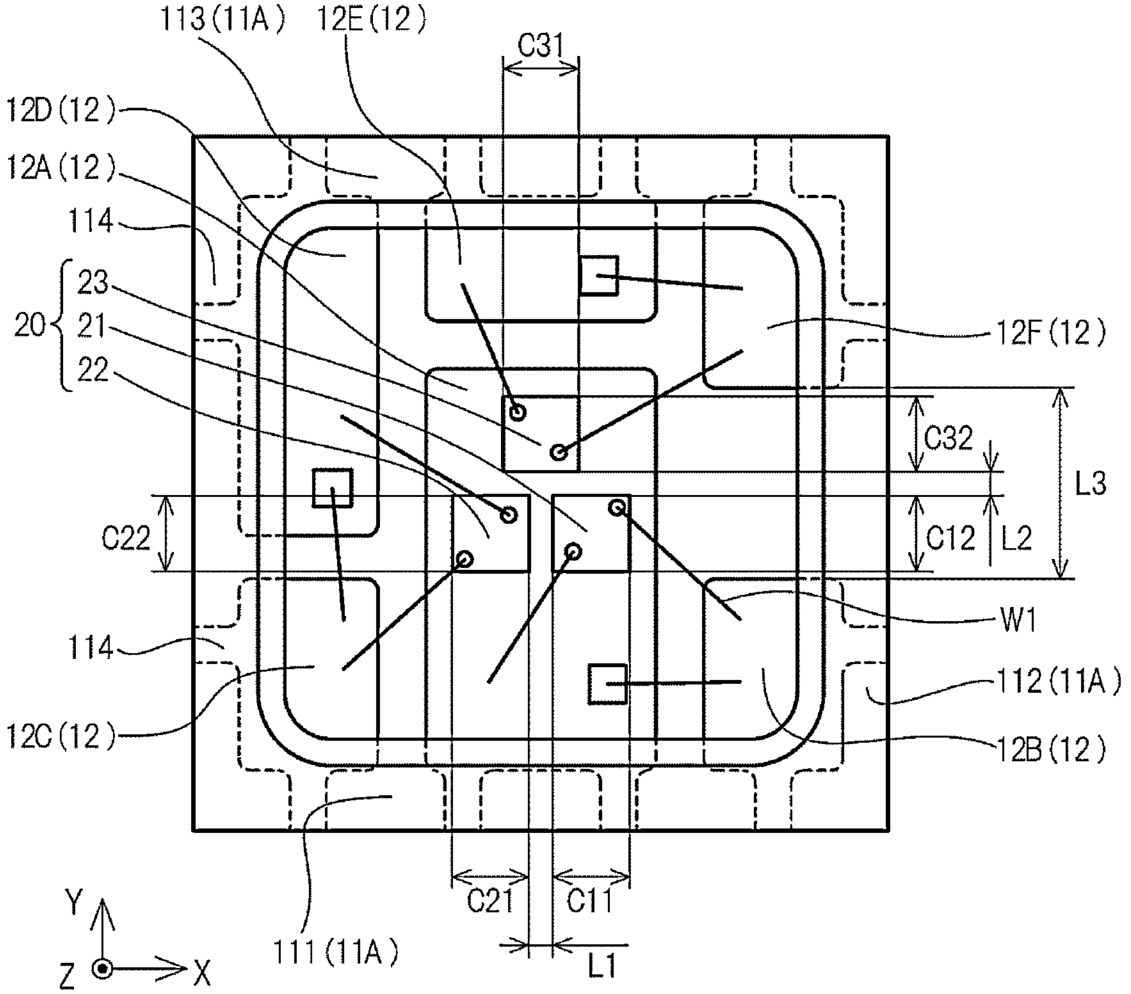
FIG. 2 is a schematic top view of a support, light-emitting elements, protective elements, and wires according to the present embodiment.

As shown in FIG. 2, a first length L1, which is the minimum length from the first light-emitting element 21 to the second light-emitting element 22 in the first direction (X direction), is preferably shorter than a first element first length C11, which is the maximum length of the first light-emitting element 21 in the first direction (X direction), and/or a second element first length C21, which is the maximum length of the second light-emitting element 22 in the first direction (X direction). This constitution reduces the distance between the first light-emitting element 21 and the second light-emitting element 22, so that improvement of the color mixing properties of the light-emitting device 1000 is facilitated. The first length L1 is preferably 0.5 times or less as large as the first element first length C11 and/or the second element first length C21. When the light-emitting device 1000 has this constitution, the distance between the first light-emitting element 21 and the second light-emitting element 22 is further reduced, so that improvement of the color mixing properties of the light-emitting device 1000 is facilitated.

As shown in FIG. 2, a first element second length C12, which is the maximum length of the first light-emitting element 21 in the second direction (Y direction), is preferably 0.9 times or more and 1.1 times or less as large as a second element second length C22, which is the maximum length of the second light-emitting element 22 in the second direction (Y direction). This constitution facilitates reduction of a portion in which the first light-emitting element 21 and the second light-emitting element 22 do not overlap each other in the second direction (Y direction). Improvement of the color mixing properties of the light-emitting device 1000 is thus facilitated. The difference between the first element second length C12 and the second element second length C22 is preferably 30 μm or less.

Figure 5:
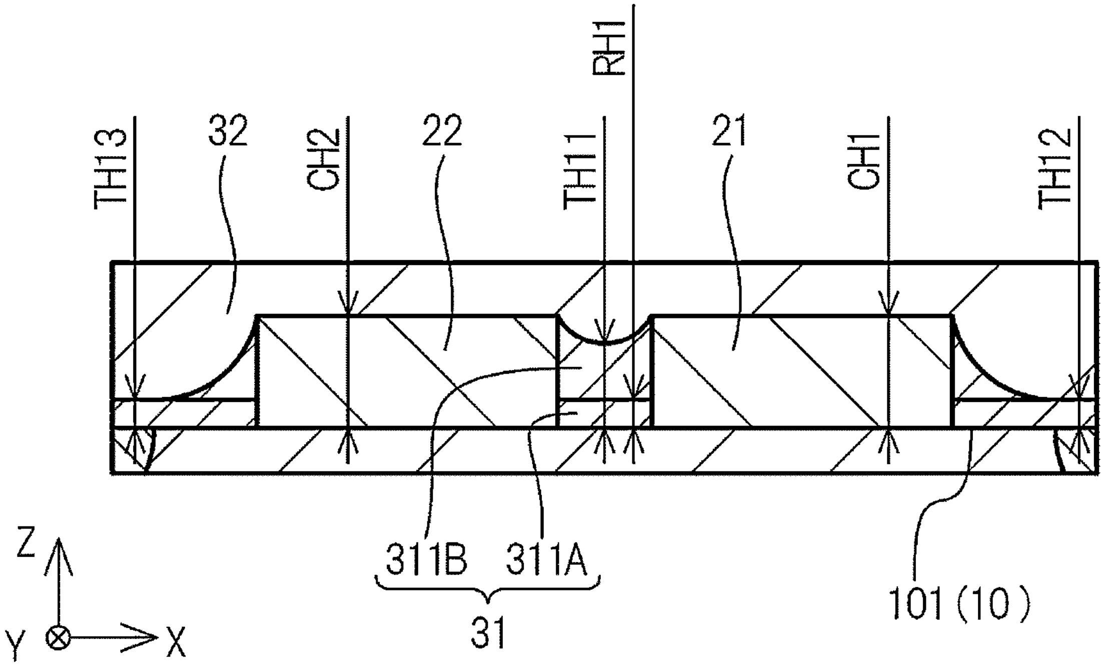
FIG. 5 is a schematic enlarged view of a portion V of the light-emitting device in FIG. 4.

As shown in FIG. 5, a first element height CH1, which is the maximum height of the first light-emitting element 21, is preferably 0.9 times or more and 1.1 times or less as large as a second element height CH2, which is the maximum height of the second light-emitting element 22. This constitution facilitates reduction of a portion in which the first light-emitting element 21 and the second light-emitting element 22 do not overlap each other in the third direction (Z direction). Improvement of the color mixing properties of the light-emitting device 1000 is thus facilitated. The difference between the first element height CH1 and the second element height CH2 is preferably 30 μm or less.

As shown in FIG. 1 and FIG. 2, in the second direction (Y direction), the third light-emitting element 23 preferably overlaps at least a portion of the first light-emitting element 21 and at least a portion of the second light-emitting element 22. This constitution facilitates mixing of light emitted from the first light-emitting element 21, light emitted from the second light-emitting element 22, and light emitted from the third light-emitting element 23. A third element first length C31, which is the maximum length of the third light-emitting element 23 in the first direction (X direction), is greater than the first length L1. The third element first length C31 is preferably shorter than the total of the first length L1, the first element first length C11, and the second element first length C21. This constitution facilitates reduction of portions in which the third light-emitting element 23 does not overlap the first light-emitting element 21 and/or the second light-emitting element 22 in the second direction (Y direction).

In a top view, at least a portion of a lateral surface of the first light-emitting element 21 and at least a portion of a lateral surface of the third light-emitting element 23 facing each other are preferably parallel to each other. This constitution is likely to make the length from the lateral surface of the first light-emitting element 21 to the lateral surface of the third light-emitting element 23 constant, so that reduction of the unevenness in color of the light-emitting device 1000 is facilitated. In the present embodiment, as shown in FIG. 1, the lateral surface of the first light-emitting element 21 and the lateral surface of the third light-emitting element 23 facing each other extend in the first direction (X direction). At least a portion of a lateral surface of the second light-emitting element 22 and at least a portion of a lateral surface of the third light-emitting element 23 facing each other are preferably parallel to each other.

As shown in FIG. 2, a second length L2, which is the minimum length from the first light-emitting element 21 to the third light-emitting element 23 in the second direction (Y direction), is preferably shorter than the first element second length C12 and/or a third element second length C32, which is the maximum length of the third light-emitting element 23 in the second direction (Y direction). This constitution reduces the distance between the first light-emitting element 21 and the third light-emitting element 23, so that improvement of the color mixing properties of the light-emitting device 1000 is facilitated. The second length L2 is preferably 0.5 times or less as large as the first element second length C12 and/or the third element second length C32. When the light-emitting device 1000 has this constitution, the distance between the first light-emitting element 21 and the third light-emitting element 23 is further reduced, so that improvement of the color mixing properties of the light-emitting device 1000 is facilitated.

Figure 7:
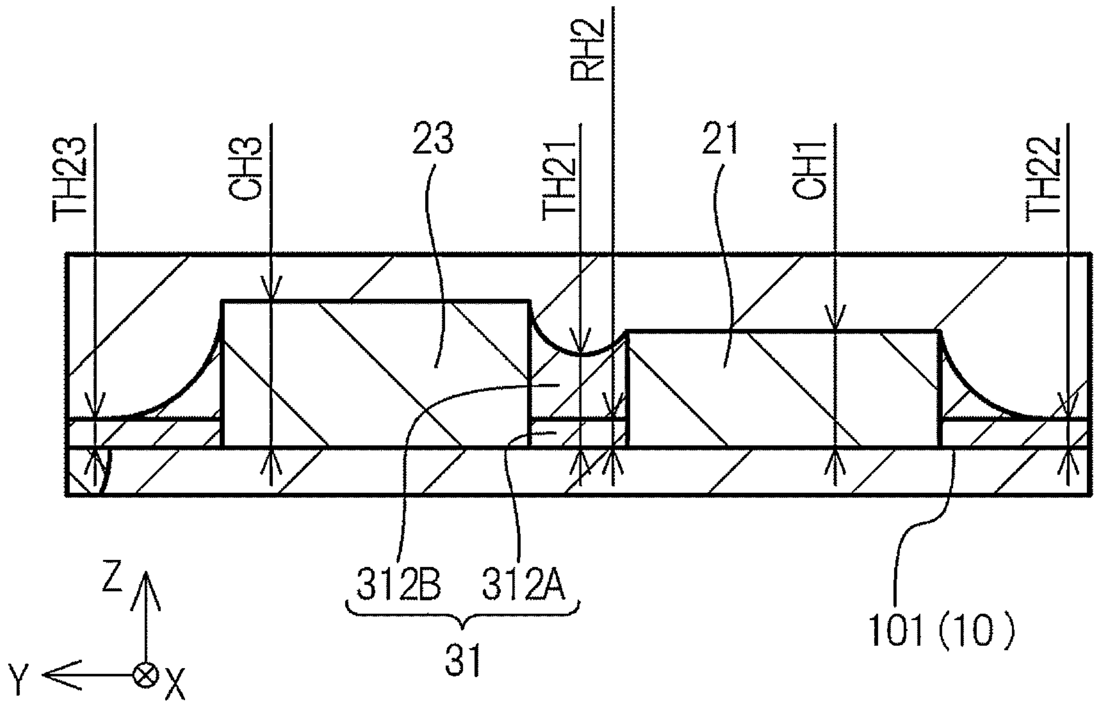
FIG. 7 is a schematic enlarged view of a portion VII of the light-emitting device in FIG. 6.

As shown in FIG. 7, a third element height CH3, which is the maximum height of the third light-emitting element 23, is preferably greater than the first element height CH1. This constitution facilitates extraction of light from the third light-emitting element 23. The difference between the third element height CH3 and the first element height CH1 is preferably 20 μm or more. The third element height CH3 may be 0.9 times or more and 1.1 times or less as large as the first element height CH1. This constitution facilitates reduction of a portion in which the first light-emitting element 21 and the third light-emitting element 23 do not overlap each other in the third direction (Z direction) and improvement of the color mixing properties of the light-emitting device 1000.

Support 10

The support 10 is a member on which the light-emitting elements 20 are to be disposed. The light-emitting elements 20 are mounted on the first surface 101 of the support 10. The light-emitting elements 20 are bonded to the first surface 101 with known bonding members such as resin, solder, and electroconductive paste. In the present embodiment, the support 10 includes a plurality of leads 12 and a resin molded body 13. The leads 12 are held by the resin molded body 13. The first surface 101 of the support 10 is defined by portions of the upper surfaces of the leads 12 and a portion of the upper surface of the resin molded body 13. At least a portion of the upper surfaces of the leads 12 and at least a portion of the upper surface of the resin molded body 13 defining the first surface 101 of the support 10 are located in the same plane. The term "same plane" in the present specification indicates that differences between the surfaces within ±15 μm are acceptable. The leads 12 may have recesses in the upper surfaces.

The leads 12 are electroconductive and function as electrodes for supplying the light-emitting elements 20 with power. The leads 12 in the present embodiment include a first lead 12A, a second lead 12B, a third lead 12C, a fourth lead 12D, a fifth lead 12E, and a sixth lead 12F. The first light-emitting element 21 and the second light-emitting element 22 are preferably disposed on the first lead 12A. This constitution makes it easy to dispose the first light-emitting element 21 and the second light-emitting element 22 closely to each other, so that improvement of the color mixing properties of the light-emitting device 1000 is facilitated. The first light-emitting element 21, the second light-emitting element 22, and the third light-emitting element 23 are preferably disposed on the first lead 12A. This constitution makes it easy to dispose the first light-emitting element 21, the second light-emitting element 22, and the third light-emitting element 23 closely to one another, so that improvement of the color mixing properties of the light-emitting device 1000 is facilitated. The first light-emitting element 21 is electrically connected to the first lead 12A and the second lead 12B via wires W1. The second light-emitting element 22 is electrically connected to the third lead 12C and the fourth lead 12D via wires. The third light-emitting element 23 is electrically connected to the fifth lead 12E and the sixth lead 12F via wires. It is preferable that the first light-emitting element 21, the second light-emitting element 22, and the third light-emitting element 23 can be independently driven. This constitution facilitates adjustment of the chromaticity of the light-emitting device 1000. A plurality of light-emitting elements 20 may be connected in series or in parallel, or series connections and parallel connections may be combined.

The area of the first lead 12A in a top view is preferably greater than the area of the second lead 12B in a top view. By providing the first lead 12A having a large area on which the first light-emitting element 21 and the second light-emitting element 22 are disposed, improvement of the heat dissipation performance of the light-emitting device 1000 is facilitated. The area of the first lead 12A in a top view is preferably greater than the areas of the second lead 12B, the third lead 12C, the fourth lead 12D, the fifth lead 12E, and the sixth lead 12F in a top view. This constitution further facilitates improvement of the heat dissipation performance of the light-emitting device 1000.

As shown in FIG. 2, the first lead 12A, the second lead 12B, and the third lead 12C are aligned in the first direction (X direction). The fourth lead 12D, the fifth lead 12E, and the sixth lead 12F are aligned in the first direction (X direction). The first lead 12A and the fifth lead 12E are aligned in the second direction (Y direction). The second lead 12B and the sixth lead 12F are aligned in the second direction (Y direction). The third lead 12C and the fourth lead 12D are aligned in the second direction (Y direction). In the first direction (X direction), the first lead 12A preferably overlaps at least a portion of the second lead 12B and at least a portion of the sixth lead 12F. Generally, the leads 12 have higher mechanical strength than the resin molded body 13. Accordingly, by disposing the first lead 12A so as to overlap at least a portion of the second lead 12B and at least a portion of the sixth lead 12F in the first direction (X direction), reduction of cracking and chipping of the resin molded body 13 due to external forces is facilitated. Improvement of the mechanical strength of the light-emitting device 1000 is thus facilitated. In the first direction (X direction), the first lead 12A preferably overlaps at least a portion of the third lead 12C and at least a portion of the fourth lead 12D. Improvement of the mechanical strength of the light-emitting device 1000 is thus facilitated.

As shown in FIG. 2, a third length L3, which is the maximum length from the second lead 12B to the sixth lead 12F in the second direction (Y direction), is preferably greater than the first element second length C12. This constitution facilitates increase of the area of the upper surface of the resin molded body 13 defining the first surface 101 of the support 10. Generally, a member containing a resin material is likely to exhibit higher adhesion to the resin molded body 13 containing a resin material than the leads 12 containing no resin material. Accordingly, increasing the area of the upper surface of the resin molded body 13 defining the first surface 101 of the support 10 facilitates improvement of the adhesion of the first covering member 31 containing a resin material and/or a light-reflective member 50 containing a resin material described below to the support. In the present specification, the expression "the length from the second lead 12B to the sixth lead 12F" refers to the length from an upper surface portion of the second lead 12B defining the first surface 101 to an upper surface portion of the sixth lead 12F defining the first surface 101. As shown in FIG. 2, the third length L3 is preferably greater than twice the first element second length C12. The third length L3 is preferably greater than the total of the first element second length C12, the second length L2, and the third element second length C32. This constitution facilitates increase of the area of the upper surface of the resin molded body 13 defining the first surface 101 of the support 10. The third length L3 may be shorter than the first element second length C12. When the light-emitting device 1000 has this constitution, improvement of the mechanical strength of the light-emitting device 1000 is facilitated.

Figure 3:
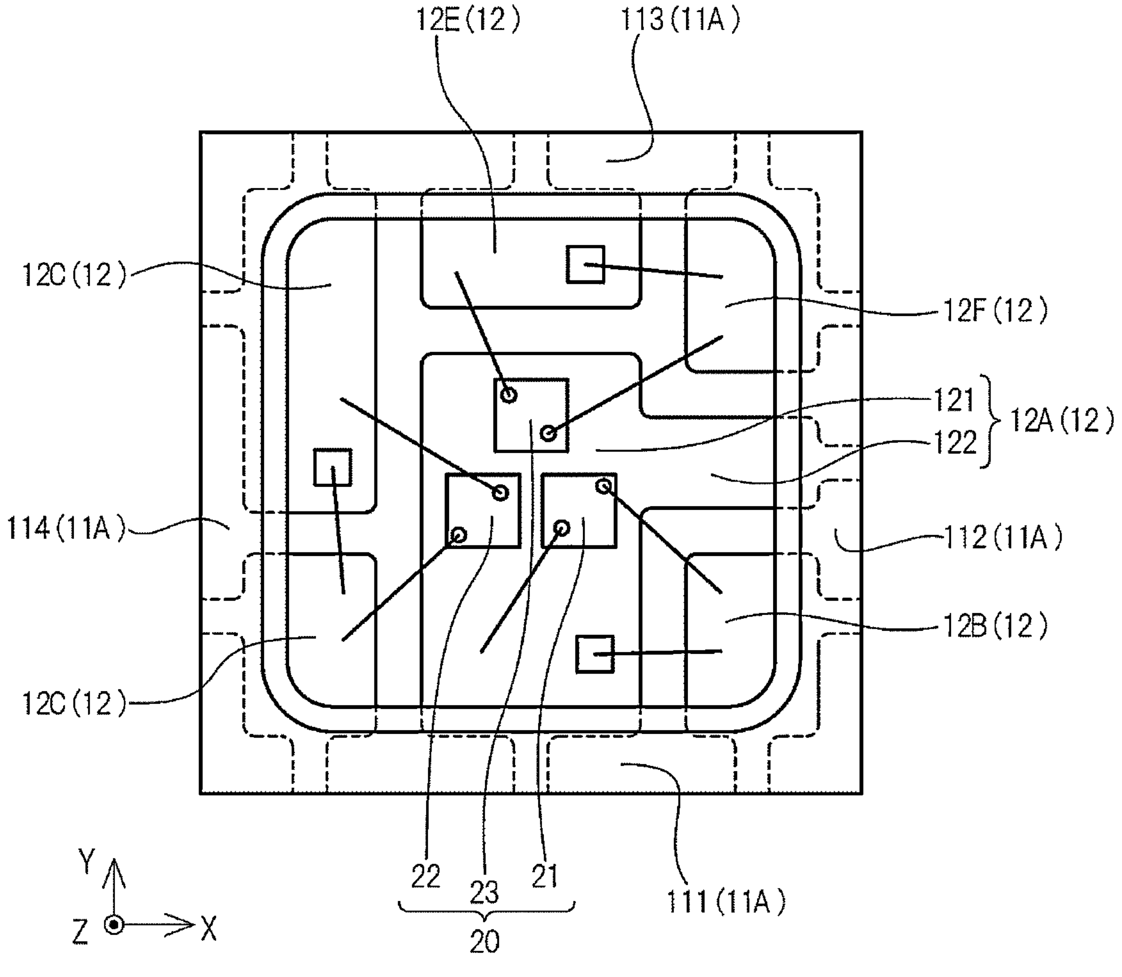
FIG. 3 is a schematic top view of a modified example of the support, the light-emitting elements, the protective elements, and the wires according to the present embodiment.

As shown in FIG. 3, the first lead 12A includes a body portion 121 and an extending portion 122 extending from the body portion 121. In the second direction (Y direction), the extending portion 122 of the first lead 12A may be located between the second lead 12B and the sixth lead 12F. Improvement of the mechanical strength of the light-emitting device 1000 is thus facilitated.

Figure 4:
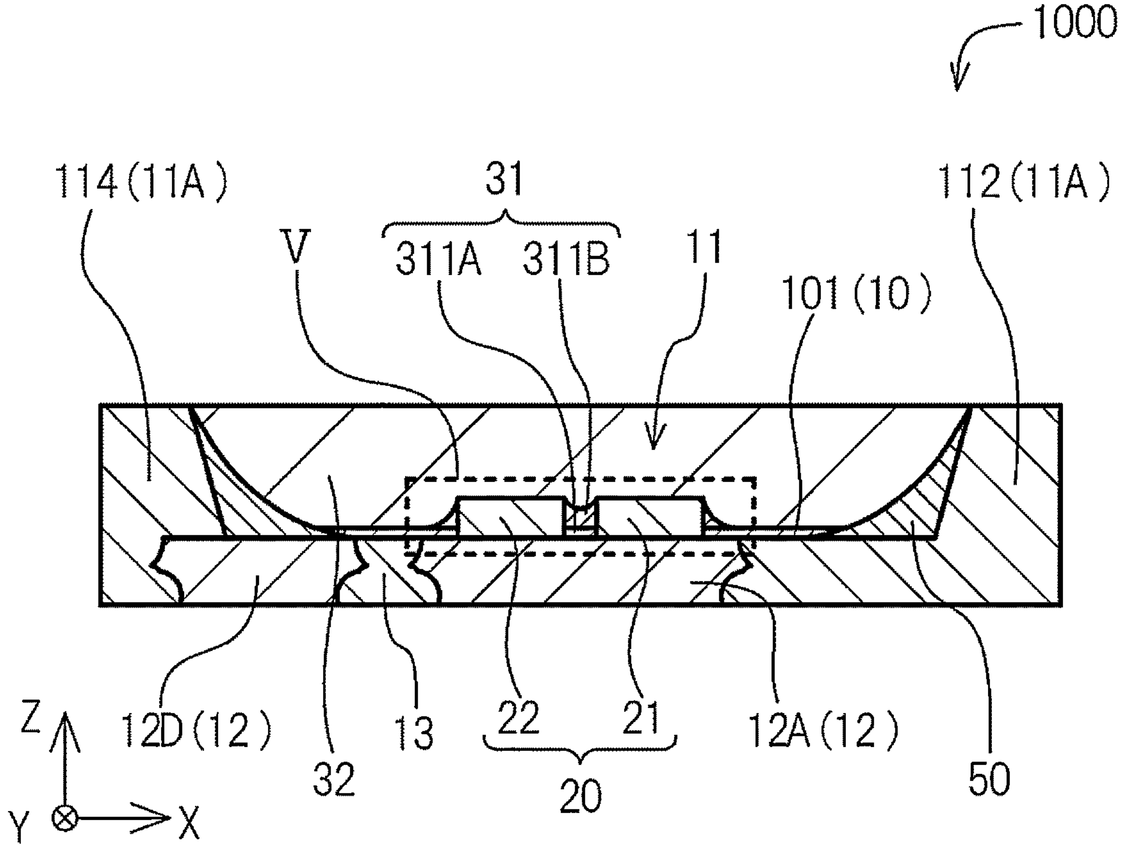
FIG. 4 is a schematic cross-sectional view of the light-emitting device taken along the line IV-IV of FIG. 1.

As shown in FIG. 4, the support 10 of the present embodiment has a recess 11 that accommodates the light-emitting elements 20. The recess 11 is defined by a lateral wall 11A and the first surface 101. The lateral wall 11A may be formed as a member separate from the resin molded body 13, or the lateral wall 11A may be constituted of the resin molded body 13 as in the present embodiment. As shown in FIG. 1, the lateral wall 11A of the present embodiment includes a first lateral wall 111, a second lateral wall 112, a third lateral wall 113, and a fourth lateral wall 114. The first lateral wall 111 and the third lateral wall 113 extend in the first direction (X direction) and face each other. The second lateral wall 112 and the fourth lateral wall 114 extend in the second direction (Y direction) and face each other.

Examples of the base material of the leads 12 include metals such as copper, aluminum, gold, silver, iron, nickel, alloys of these metals, phosphor bronze, and copper-iron alloys. These metals may form a single layer or a multilayer structure (such as a clad material). In particular, copper, which is inexpensive and exhibits high heat dissipation performance, is preferably used for the base material. The lead may have a metal layer on a surface of the base material. For example, the metal layer contains gold, silver, aluminum, nickel, palladium, rhodium, copper, or an alloy of these metals. The metal layer may be provided on an entirety of a surface of the lead or on a portion of the lead. Different metal layers may be provided in a region on the upper surface of the lead and a region on the lower surface of the lead. For example, the metal layer formed on the upper surface of the lead is a metal layer formed of a plurality of layers including a metal layer containing nickel and silver, and the metal layer formed on the lower surface of the lead is a metal layer not including a metal layer containing nickel. A metal layer containing gold or the like formed on the upper surface of the lead can have a greater thickness than a metal layer containing gold or the like formed on the lower surface of the lead.

In the case in which a metal layer containing silver is formed on the outermost surface of the lead 12, a protective layer of silicon oxide or the like is preferably provided on the surface of the metal layer containing silver. Discoloration of the metal layer containing silver due to sulfur components in the atmosphere or the like can thus be suppressed. The protective layer can be formed by a vacuum process such as sputtering, but other known methods may be used.

A known material such as thermosetting resins and thermoplastic resins can be used for the resin material to serve as a base material of the resin molded body 13. Examples of thermoplastic resins to be used include polyphthalamide resins, polybutylene terephthalate (PBT), and unsaturated polyesters. Examples of thermosetting resins to be used include epoxy resins, modified epoxy resins, silicone resins, and modified silicone resins. In particular, a thermosetting resin, such as epoxy resins and silicone resins, which have good resistance to heat and light, is preferably used for the resin material.

The resin molded body 13 preferably contains a light-reflective substance in the resin material to serve as a base material. For the light-reflective substance, a material that is less likely to absorb light emitted from the light-emitting elements 20 and greatly differs in refractive index from the resin material to serve as a base material is preferably used. Examples of the light-reflective substance include titanium oxide, zinc oxide, silicon oxide, zirconium oxide, aluminum oxide, and aluminum nitride. The resin molded body 13 may contain a light-absorbing substance in the resin material to serve as a base material. For example, a dark-colored pigment such as carbon black can be used for the light-absorbing substance.

A wiring board including a substrate and wiring may be used for the support 10. The substrate can be constituted of a resin, a ceramic, glass, or the like. A known material such as thermosetting resins and thermoplastic resins above can be used for the resin. Examples of the ceramic include aluminum oxide, aluminum nitride, zirconium oxide, zirconium nitride, titanium oxide, titanium nitride, and mixtures of these materials. The wiring can be formed of copper, iron, nickel, tungsten, chromium, aluminum, silver, gold, titanium, palladium, rhodium, or an alloy of these metals. A single layer or a multilayer of such a metal or alloy may be used.

First Covering Member 31

The first covering member 31 covers at least a portion of a lateral surface of the first light-emitting element and at least a portion of a lateral surface of the second light-emitting element. Light emitted from the lateral surface of the first light-emitting element and light emitted from the lateral surface of the second light-emitting element are guided through the first covering member 31, so that improvement of the color mixing properties of the light-emitting device 1000 is facilitated. The first covering member 31 exposes at least a portion of the upper surface of the first light-emitting element and at least a portion of the upper surface of the second light-emitting element.

Figure 10:
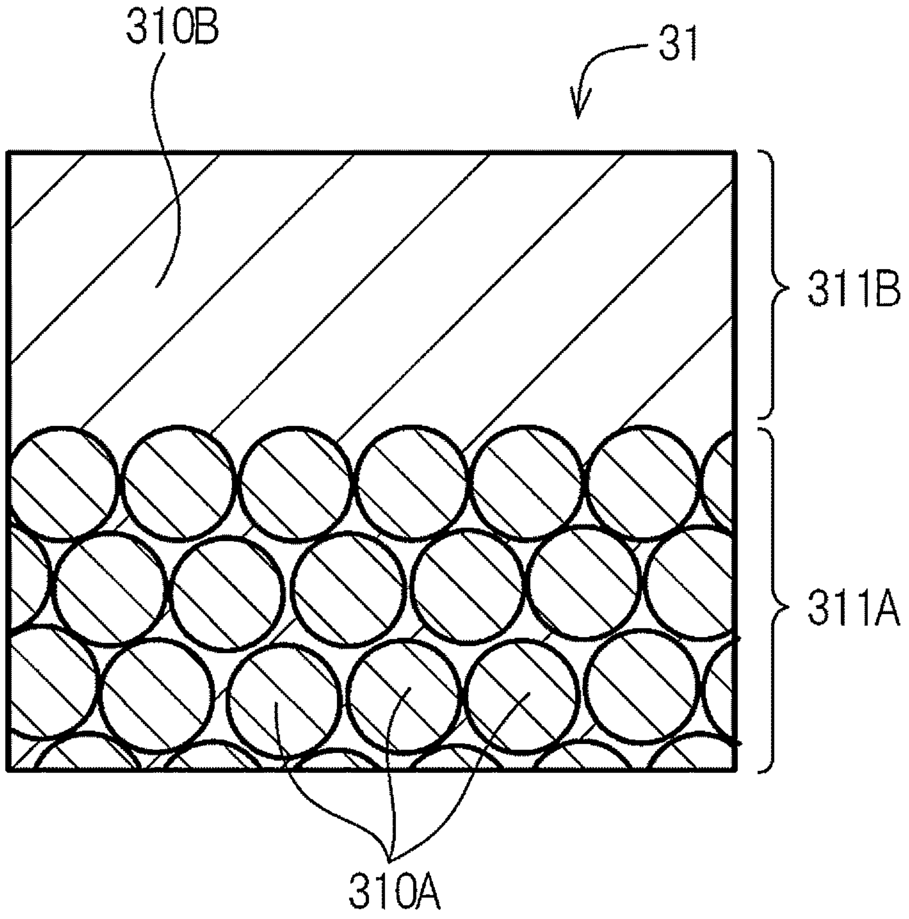
FIG. 10 is a schematic enlarged cross-sectional view of a portion of a first covering member according to the present embodiment.

As shown in FIG. 10, the first covering member 31 contains a plurality of first reflective particles 310A. The first covering member 31 of the present embodiment contains a plurality of first reflective particles 310A and a base material 310B made of a light-transmissive material. The same light-reflective substance as in the resin molded body 13 can be used for the first reflective particles 310A. For example, the same resin material as in the resin molded body 13 can be used for the base material 310B of the first covering member 31.

The first covering member 31 includes a reflective portion and a light-transmissive portion located above the reflective portion. In a certain cross section, the ratio of the area of the first reflective particles 310A to the area of the reflective portion is higher than the ratio of the area of the second reflective particles 320A to the area of the second covering member 32 described below. In a certain cross section, the ratio of the area of the first reflective particles 310A to the area of the light-transmissive portion is lower than the ratio of the area of the second reflective particles 320A to the area of the second covering member 32 described below. For example, the first reflective particles 310A can be sedimented to the first surface 101 side by spontaneous sedimentation, centrifugal sedimentation, or the like. For example, the centrifugal sedimentation is performed using a centrifuge. For example, the first covering member 31 can be formed by sedimenting the first reflective particles 310A to the first surface 101 side in the unhardened first covering member 31 using a centrifuge or the like and then hardening the unhardened first covering member 31. Alternatively, the first covering member 31 may be formed by hardening the unhardened first covering member 31 while sedimenting the first reflective particles 310A to the first surface 101 side in the unhardened first covering member 31 using a centrifuge or the like.

A cross section passing through the first light-emitting element 21 and the second light-emitting element 22 and lying in a plane perpendicular to the first surface 101 is referred to as the first cross section. As shown in FIG. 4, in the first cross section, the first covering member 31 includes the first reflective portion 311A and the first light-transmissive portion 311B located above the first reflective portion 311A. In the first cross section, the ratio of the area of the first reflective particles 310A to the area of the first reflective portion 311A is higher than the ratio of the area of the second reflective particles 320A to the area of the second covering member 32 described below. In the first cross section, the ratio of the area of the first reflective particles 310A to the area of the first light-transmissive portion 311B is lower than the ratio of the area of the second reflective particles 320A to the area of the second covering member 32 described below. As shown in FIG. 10, in the first cross section, the ratio of the area of the first reflective particles 310A to the area of the first light-transmissive portion 311B is lower than the ratio of the area of the first reflective particles 310A to the area of the first reflective portion 311A. This constitution makes guiding of light from the light-emitting elements 20 through the first light-transmissive portion 311B easier than through the first reflective portion 311A. In the present embodiment, the expression "the area of the first reflective portion 311A in the first cross section" refers to the total of the area of the base material 310B and the area of the first reflective particles 310A constituting the first reflective portion 311A.

In the first cross section, the ratio of the area of the first reflective particles 310A to the area of the first light-transmissive portion 311B is preferably 0.2 times or less as large as the ratio of the area of the first reflective particles 310A to the area of the first reflective portion 311A. This constitution facilitates guiding of light emitted from the first light-emitting element 21 and light emitted from the second light-emitting element 22 through the first light-transmissive portion 311B. The first light-transmissive portion 311B may not contain a plurality of first reflective particles. This constitution further facilitates guiding of light emitted from the first light-emitting element 21 and light emitted from the second light-emitting element 22 through the first light-transmissive portion 311B.

As shown in FIG. 5, in the first cross section, a first light-transmissive portion first height TH11, which is the minimum height of the first light-transmissive portion 311B located between the first light-emitting element 21 and the second light-emitting element 22 as measured from the first surface 101 of the support 10, is preferably greater than a first light-transmissive portion second height TH12, which is the minimum height of the first light-transmissive portion 311B located outward of the first light-emitting element 21 as measured from the first surface 101 of the support 10. This constitution facilitates increase of the area of the first light-transmissive portion 311B located between the first light-emitting element 21 and the second light-emitting element 22 in the first cross section. Light emitted from the first light-emitting element 21 and light emitted from the second light-emitting element 22 are thus easily mixed together in the first light-transmissive portion 311B located between the first light-emitting element and the second light-emitting element. In the present specification, the statement "located outward of the light-emitting element" means that the distance from the position to the outer edge of the light-emitting device located closer to the light-emitting element in the lateral direction is shorter than the distance from the light-emitting element. In the present embodiment, the expression "first light-transmissive portion 311B located outward of the first light-emitting element 21 in the first cross section" refers to a portion of the first light-transmissive portion 311B located between the first light-emitting element 21 and the second lateral wall 112 in the first direction (X direction).

As shown in FIG. 5, in the first cross section, the first light-transmissive portion first height TH11 is preferably greater than a third light-transmissive portion first height TH13, which is the minimum height of the first light-transmissive portion 311B located outward of the second light-emitting element 22. This constitution facilitates increase of the area of the first light-transmissive portion 311B located between the first light-emitting element 21 and the second light-emitting element 22 in the first cross section. In the present embodiment, the expression "first light-transmissive portion 311B located outward of the second light-emitting element 22 in the first cross section" refers to a portion of the first light-transmissive portion 311B located between the second light-emitting element 22 and the fourth lateral wall 114 in the first direction (X direction).

The first light-transmissive portion 311B of the first covering member 31 is preferably in contact with the first light-emitting element 21 and the second light-emitting element 22. This constitution facilitates guiding of light emitted from the first light-emitting element 21 and light emitted from the second light-emitting element 22 through the first light-transmissive portion 311B. The height of the portion of the first light-transmissive portion 311B in contact with the first light-emitting element 21 and the height of the portion of the first light-transmissive portion 311B in contact with the second light-emitting element 22 are preferably greater than the first light-transmissive portion first height TH11. This constitution facilitates guiding of light emitted from the first light-emitting element 21 and light emitted from the second light-emitting element 22 through the first light-transmissive portion 311B.

In the first cross section, the ratio of the area of the first reflective particles 310A to the area of the first reflective portion 311A is higher than the ratio of the area of the first reflective particles 310A to the area of the first light-transmissive portion 311B. This constitution makes guiding of light from the light-emitting elements 20 through the first reflective portion 311A more difficult than through the first light-transmissive portion 311B. The first reflective portion 311A covering the first surface 101 facilitates reduction of absorption of light emitted from the light-emitting elements 20 into the first surface 101 of the support 10. The first reflective portion 311A of the first covering member 31 is preferably in contact with the first surface 101. This constitution facilitates miniaturization of the light-emitting device 1000.

As shown in FIG. 5, in the first cross section, the first light-transmissive portion first height TH11 is preferably 1.5 times or more and 10 times or less as large as a first reflective portion height RH1, which is the minimum height of the first reflective portion 311A located between the first light-emitting element 21 and the second light-emitting element 22. With the first light-transmissive portion first height TH11 being 1.5 times or more as large as the first reflective portion height RH1 in the first cross section, increase of the area of the first light-transmissive portion 311B located between the first light-emitting element 21 and the second light-emitting element 22 is facilitated. Light emitted from the first light-emitting element 21 and light emitted from the second light-emitting element 22 are thus easily guided through the first light-transmissive portion 311B, so that the color mixing properties of the light-emitting device 1000 are improved. In the first cross section, the first light-transmissive portion first height TH11 is preferably 10 times or less as large as the first reflective portion height RH1; that is, in the first cross section, the first reflective portion height RH1 is preferably 0.1 or more as large as the first light-transmissive portion first height TH11. This constitution facilitates increase of the area of the first reflective portion 311A located between the first light-emitting element 21 and the second light-emitting element 22. Reduction of the transmittance of the first reflective portion 311A is thus facilitated, so that reduction of absorption of light emitted from the first light-emitting element 21 and light emitted from the second light-emitting element 22 into the first surface 101 of the support 10 is facilitated.

In the first cross section, the first light-transmissive portion first height TH11 is preferably 0.5 times or more and once or less as large as the first element height CH1. With the first light-transmissive portion first height TH11 being 0.5 times or more as large as the first element height CH1, increase of the area of the first light-transmissive portion 311B located between the first light-emitting element 21 and the second light-emitting element 22 is facilitated. With the first light-transmissive portion first height TH11 being once or less as large as the first element height CH1, exposure of the upper surface of the first light-emitting element 21 from the first light-transmissive portion 311B of the first covering member 31 is facilitated. Diffusion of light emitted upward from the upper surface of the first light-emitting element 21 by the second reflective particles 320A contained in the second covering member 32 is thus facilitated. The light emitted from the first light-emitting element 21 and the light emitted from the second light-emitting element 22 are thus easily mixed in the second covering member 32, so that improvement of the color mixing properties of the light-emitting device 1000 is facilitated. It is preferable that an entirety of an upper surface of the first light-emitting element 21 be exposed from the first covering member 31. This constitution facilitates mixing of light emitted from the first light-emitting element 21 and light emitted from the second light-emitting element 22 in the second covering member 32. Similarly, in the first cross section, the first light-transmissive portion first height TH11 is preferably 0.5 times or more and once or less as large as the second element height CH2. It is preferable that an entirety of an upper surface of the second light-emitting element 22 be exposed from the first covering member 31.

Figure 6:
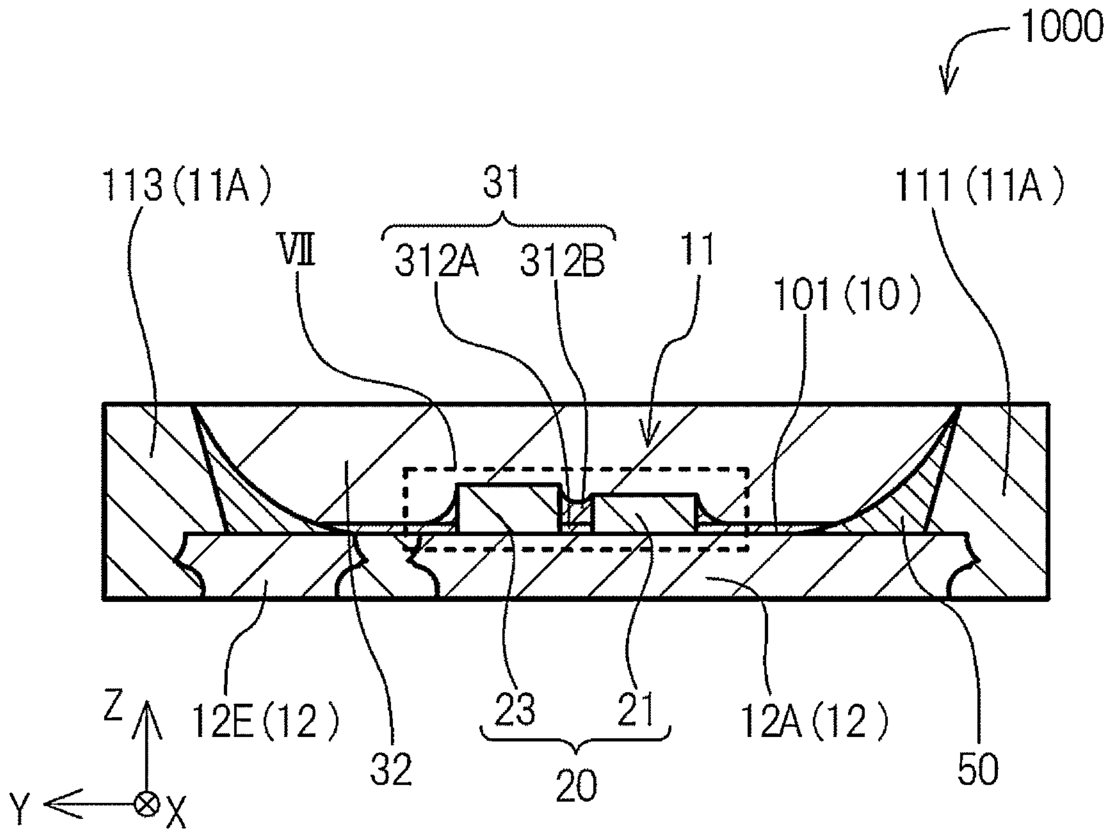
FIG. 6 is a schematic cross-sectional view of the light-emitting device taken along the line VI-VI of FIG. 1.

A cross section passing through the first light-emitting element 21 and the third light-emitting element 23 and lying in a plane perpendicular to the first surface 101 is referred to as a second cross section. As shown in FIG. 6, in the second cross section, the first covering member 31 includes a second reflective portion 312A and a second light-transmissive portion 312B located above the second reflective portion 312A. In the second cross section, the ratio of the area of the first reflective particles 310A to the area of the second reflective portion 312A is higher than the ratio of the area of the second reflective particles 320A to the area of the second covering member 32 described below. In the second cross section, the ratio of the area of the first reflective particles 310A to the area of the second light-transmissive portion 312B is lower than the ratio of the area of the second reflective particles 320A to the area of the second covering member 32 described below. In the second cross section, the ratio of the area of the first reflective particles 310A to the area of the second light-transmissive portion 312B is lower than the ratio of the area of the first reflective particles 310A to the area of the second reflective portion 312A. This constitution makes guiding of light from the light-emitting elements 20 through the second light-transmissive portion 312B easier than through the second reflective portion 312A. In the present embodiment, the expression "the area of the second reflective portion 312A in the second cross section" refers to the total of the area of the base material 310B and the area of the first reflective particles 310A constituting the second reflective portion 312A.

The ratio of the area of the first reflective particles 310A to the area of the second reflective portion 312A in the second cross section is preferably 0.8 times or more and 1.2 times or less as large as the ratio of the area of the first reflective particles 310A to the area of the first reflective portion 311A in the first cross section. This constitution facilitates reduction of the difference between the ratio of the area of the first reflective particles 310A to the area of the second reflective portion 312A in the second cross section and the ratio of the area of the first reflective particles 310A to the area of the first reflective portion 311A in the first cross section. Reduction of the unevenness in color of the light-emitting device 1000 is thus facilitated. The ratio of the area of the first reflective particles 310A to the area of the second light-transmissive portion 312B in the second cross section is preferably 0.8 times or more and 1.2 times or less as large as the ratio of the area of the first reflective particles 310A to the area of the first light-transmissive portion 311B in the first cross section.

In the second cross section, the ratio of the area of the first reflective particles 310A to the area of the second light-transmissive portion 312B is preferably 0.2 times or less as large as the ratio of the area of the first reflective particles 310A to the area of the second reflective portion 312A. This constitution facilitates guiding of light emitted from the first light-emitting element 21 and light emitted from the second light-emitting element 22 through the second light-transmissive portion 312B. The second light-transmissive portion 312B may not contain a plurality of first reflective particles. This constitution further facilitates guiding of light emitted from the first light-emitting element 21 and light emitted from the second light-emitting element 22 through the second light-transmissive portion 312B.

As shown in FIG. 7, in the second cross section, a second light-transmissive portion first height TH21, which is the minimum height of the second light-transmissive portion 312B located between the first light-emitting element 21 and the third light-emitting element 23, is preferably greater than a second light-transmissive portion second height TH22, which is the minimum height of the first light-transmissive portion located outward of the first light-emitting element 21. This constitution facilitates increase of the area of the second light-transmissive portion 312B located between the first light-emitting element 21 and the third light-emitting element 23 in the second cross section. Light emitted from the first light-emitting element 21 and light emitted from the third light-emitting element 23 are thus easily mixed together in the second light-transmissive portion 312B located between the first light-emitting element and the third light-emitting element. In the present embodiment, the expression "second light-transmissive portion 312B located outward of the first light-emitting element 21 in the second cross section" refers to a portion of the second light-transmissive portion 312B located between the first light-emitting element 21 and the first lateral wall 111 in the second direction (Y direction).

As shown in FIG. 7, in the second cross section, the second light-transmissive portion first height TH21 is preferably greater than a second light-transmissive portion third height TH23, which is the minimum height of the light-transmissive portion located outward of the third light-emitting element 23. This constitution facilitates increase of the area of the second light-transmissive portion 312B located between the first light-emitting element 21 and the third light-emitting element 23 in the second cross section. In the present embodiment, the expression "second light-transmissive portion 312B located outward of the third light-emitting element 23 in the second cross section" refers to a portion of the second light-transmissive portion 312B located between the third light-emitting element 23 and the third lateral wall 113 in the second direction (Y direction).

The second light-transmissive portion 312B of the first covering member 31 is preferably in contact with the first light-emitting element 21 and the third light-emitting element 23. This constitution facilitates guiding of light emitted from the first light-emitting element 21 and light emitted from the third light-emitting element 23 through the second light-transmissive portion 312B. The height of the portion of the second light-transmissive portion 312B in contact with the first light-emitting element 21 and the height of the portion of the second light-transmissive portion 312B in contact with the third light-emitting element 23 are preferably greater than the second light-transmissive portion first height TH21. This constitution facilitates guiding of light emitted from the first light-emitting element 21 and light emitted from the third light-emitting element 23 through the second light-transmissive portion 312B.

In the second cross section, the ratio of the area of the first reflective particles 310A to the area of the second reflective portion 312A is higher than the ratio of the area of the first reflective particles 310A to the area of the second light-transmissive portion 312B. This constitution makes guiding of light from the light-emitting elements 20 through the second reflective portion 312A more difficult than through the second light-transmissive portion 312B. The second reflective portion 312A covering the first surface 101 facilitates reduction of absorption of light emitted from the light-emitting elements 20 into the first surface 101 of the support 10. The second reflective portion 312A of the first covering member 31 is preferably in contact with the first surface 101. This constitution facilitates miniaturization of the light-emitting device 1000.

As shown in FIG. 7, in the second cross section, the second light-transmissive portion first height TH21 is preferably 1.5 times or more and 10 times or less as large as a second reflective portion height RH2, which is the minimum height of the second reflective portion 312A located between the first light-emitting element 21 and the third light-emitting element 23. With the second light-transmissive portion first height TH21 being 1.5 times or more as large as the second reflective portion height RH2 in the second cross section, increase of the area of the second light-transmissive portion 312B located between the first light-emitting element 21 and the third light-emitting element 23 is facilitated. Light emitted from the first light-emitting element 21 and light emitted from the third light-emitting element 23 are thus easily guided through the second light-transmissive portion 312B, so that the color mixing properties of the light-emitting device 1000 are improved. With the second light-transmissive portion first height TH21 being 10 times or less as large as the second reflective portion height RH2 in the second cross section, increase of the area of the second reflective portion 312A located between the first light-emitting element 21 and the third light-emitting element 23 is facilitated. Reduction of the transmittance of the second reflective portion 312A is thus facilitated, so that reduction of absorption of light emitted from the first light-emitting element 21 and light emitted from the third light-emitting element 23 into the first surface 101 of the support 10 is facilitated.

In the second cross section, the second light-transmissive portion first height TH21 is preferably 0.5 times or more and once or less as large as the first element height CH1. With the second light-transmissive portion first height TH21 being 0.5 times or more as large as the first element height CH1, increase of the area of the second light-transmissive portion 312B located between the first light-emitting element 21 and the third light-emitting element 23 is facilitated. With the second light-transmissive portion first height TH21 being once or less as large as the first element height CH1, exposure of the upper surface of the first light-emitting element 21 from the second light-transmissive portion 312B of the first covering member 31 is facilitated. Diffusion of light emitted upward from the upper surface of the first light-emitting element 21 by the second reflective particles 320A contained in the second covering member 32 is thus facilitated. Light emitted from the first light-emitting element 21 and light emitted from the third light-emitting element 23 are thus easily mixed in the second covering member 32, so that improvement of the color mixing properties of the light-emitting device 1000 is facilitated.

Figure 8:
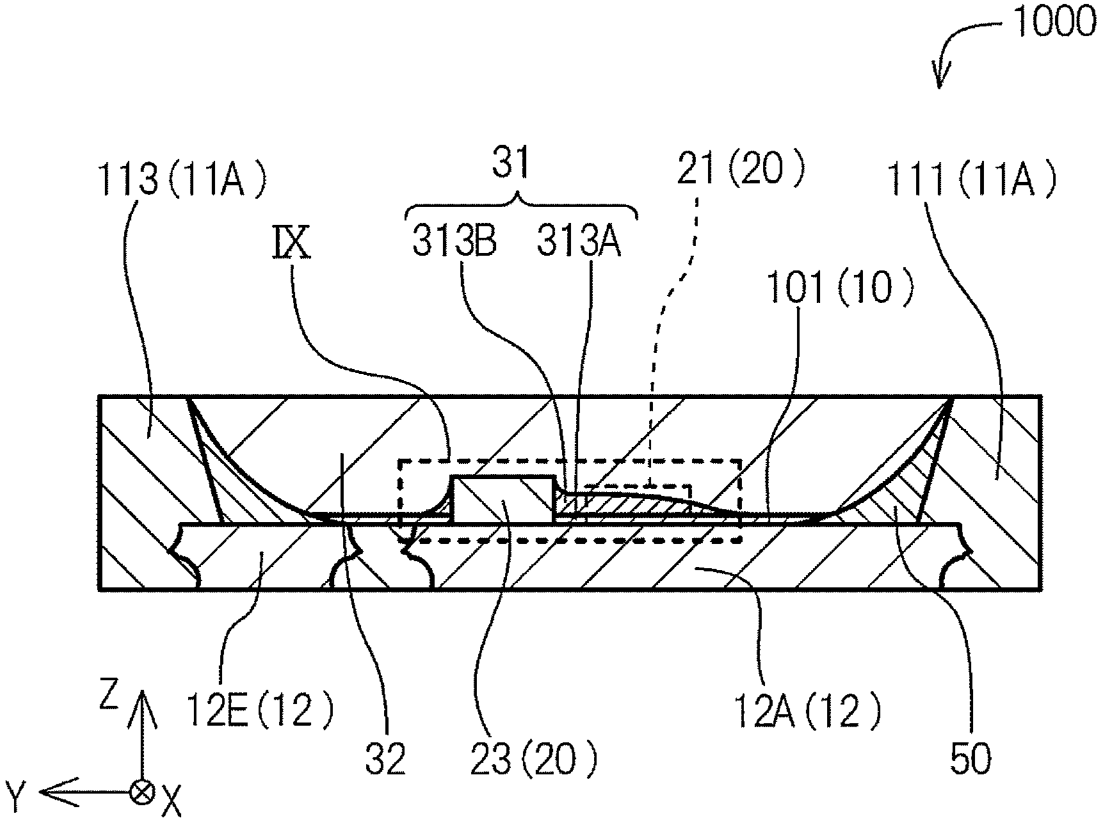
FIG. 8 is a schematic cross-sectional view of the light-emitting device taken along the line VIII-VIII of FIG. 1.

A cross section passing through the region between the first light-emitting element 21 and the second light-emitting element 22 in a top view and the third light-emitting element 23 and lying in a plane perpendicular to the first surface 101 is referred to as a third cross section. The third cross section is spaced apart from (i.e., the third cross section does not pass through) the first light-emitting element 21 and the second light-emitting element 22. As shown in FIG. 8, in the third cross section, the first covering member 31 includes a third reflective portion 313A and a third light-transmissive portion 313B located above the third reflective portion 313A. In the third cross section, the ratio of the area of the first reflective particles 310A to the area of the third reflective portion 313A is higher than the ratio of the area of the second reflective particles 320A to the area of the second covering member 32 described below. In the third cross section, the ratio of the area of the first reflective particles 310A to the area of the third light-transmissive portion 313B is lower than the ratio of the area of the second reflective particles 320A to the area of the second covering member 32 described below. In the third cross section, the ratio of the area of the first reflective particles 310A to the area of the third light-transmissive portion 313B is lower than the ratio of the area of the first reflective particles 310A to the area of the third reflective portion 313A. This constitution makes guiding of light from the light-emitting elements 20 through the third light-transmissive portion 313B easier than through the third reflective portion 313A. In the present embodiment, the expression "the area of the third reflective portion 313A in the third cross section" is the total of the area of the base material 310B and the area of the first reflective particles 310A constituting the third reflective portion 313A.

The ratio of the area of the first reflective particles 310A to the area of the third reflective portion 313A in the third cross section is preferably 0.8 times or more and 1.2 times or less as large as the ratio of the area of the first reflective particles 310A to the area of the first reflective portion 311A in the first cross section. This constitution facilitates reduction of the unevenness in color of the light-emitting device 1000. The ratio of the area of the first reflective particles 310A to the area of the third light-transmissive portion 313B is preferably 0.8 times or more and 1.2 times or less as large as the ratio of the area of the first reflective particles 310A to the area of the first light-transmissive portion 311B.

Figure 9:
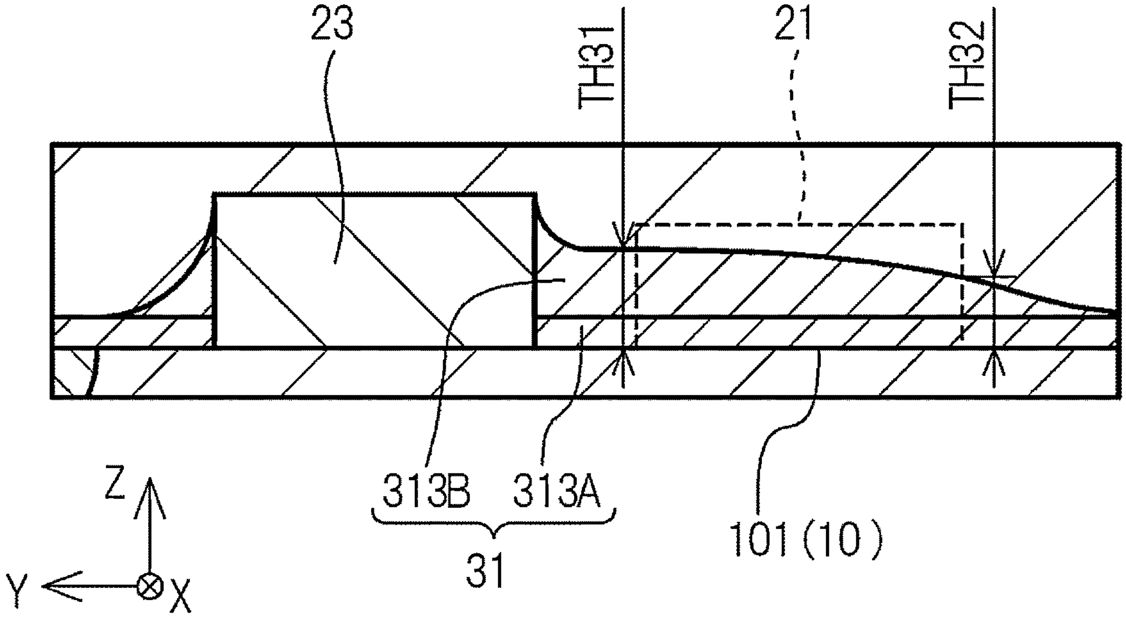
FIG. 9 is a schematic enlarged view of a portion IX of the light-emitting device in FIG. 8.

As shown in FIG. 9, a third light-transmissive portion first height TH31, which is the height of a first region of the third light-transmissive portion 313B that overlaps the first light-emitting element 21 in the first direction (X direction) and is located closest to the third light-emitting element, is preferably greater than a third light-transmissive portion second height TH32, which is the height of a second region of the third light-transmissive portion 313B that overlaps the first light-emitting element 21 in the first direction (X direction) and is located farthest from the third light-emitting element. This constitution facilitates mixing of light emitted from the first light-emitting element 21 and light emitted from the third light-emitting element 23 in the third light-transmissive portion 313B.

Second Covering Member 32

The second covering member 32 covers at least a portion of the upper surface of the first light-emitting element 21 and at least a portion of the upper surface of the second light-emitting element 22. The upper surfaces of the first light-emitting element 21 and the second light-emitting element 22 can thus be protected against external forces and the like. In the present embodiment, the upper surface of the second covering member 32 serves as an emission surface of the light-emitting device 1000.

The second covering member 32 contains a plurality of second reflective particles 320A. Diffusion of light emitted from the upper surface of the first light-emitting element 21 and light emitted from the upper surface of the second light-emitting element 22 in the second covering member 32 is thus facilitated, so that improvement of the color mixing properties of the light-emitting device 1000 is facilitated.

Figure 11:
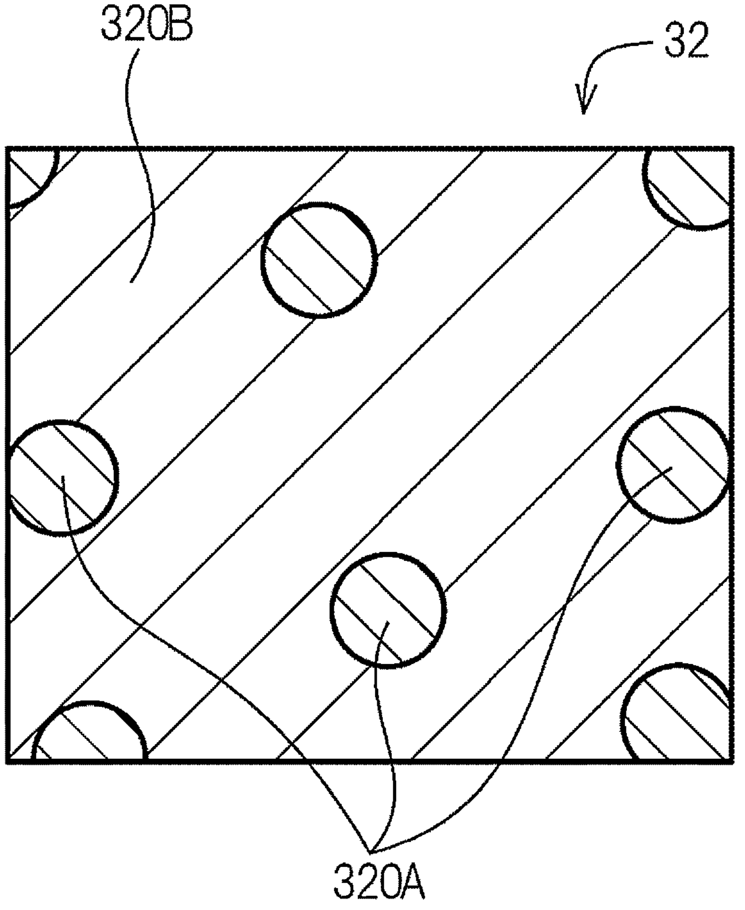
FIG. 11 is a schematic enlarged cross-sectional view of a portion of a second covering member according to the present embodiment.

As shown in FIG. 11, the second covering member 32 of the present embodiment contains a plurality of second reflective particles 320A and a base material 320B made of a light-transmissive material. The same light-reflective substance as in the resin molded body 13 can be used for the second reflective particles 320A. For example, the same resin material as in the resin molded body 13 can be used for the base material 320B of the second covering member 32. The refractive index of the base material 310B of the first covering member 31 may be the same as or different from the refractive index of the base material 320B of the second covering member 32. In the case in which the base material 310B of the first covering member 31 differs from the base material 320B of the second covering member 32 in refractive index, the refractive index of the base material 320B of the second covering member 32 is preferably lower than the refractive index of the base material 310B of the first covering member 31. This constitution facilitates total reflection of light emitted from the first light-emitting element and light emitted from the second light-emitting element 22 on the interface between the first covering member 31 and the second covering member 32. This constitution facilitates mixing of light emitted from the first light-emitting element and light emitted from the second light-emitting element 22 in the first light-transmissive portion 311B. In the present specification, the term "the refractive index" is the refractive index at the peak wavelength of the light-emitting element 20. In the case in which the light-emitting device includes a plurality of light-emitting elements 20, the refractive index is the refractive index at the peak wavelength of one of the light-emitting elements 20.

The refractive index of the base material 310B of the first covering member 31 may be 0.9 times or more and 1.1 times or less as large as the refractive index of the base material 320B of the second covering member 32. This constitution facilitates reduction of refraction and reflection of light emitted from the first light-emitting element and light emitted from the second light-emitting element 22 on the interface between the first covering member 31 and the second covering member 32. Variations of light emitted from the light-emitting device due to variations of the shapes of the first covering member 31 and the second covering member 32 are thus reduced so that the yield of the light-emitting device is improved.

In the first cross section, the ratio of the area of the second reflective particles 320A to the area of the second covering member 32 is lower than the ratio of the area of the first reflective particles 310A to the area of the first reflective portion 311A. In the first cross section, the ratio of the area of the second reflective particles 320A to the area of the second covering member 32 is preferably 0.001 times or more and 0.2 times or less as large as the ratio of the area of the first reflective particles 310A to the area of the first reflective portion 311A. If the ratio of the area of the second reflective particles 320A to the area of the second covering member 32 is 0.001 times or more as large as the ratio of the area of the first reflective particles 310A to the area of the first reflective portion 311A in the first cross section, diffusion of light emitted from the upper surface of the first light-emitting element 21 and light emitted from the upper surface of the second light-emitting element 22 in the second covering member 32 is facilitated. If the ratio of the area of the second reflective particles 320A to the area of the second covering member 32 is 0.2 times or less as large as the ratio of the area of the first reflective particles 310A to the area of the first reflective portion 311A in the first cross section, extraction of light emitted from the first light-emitting element 21 and light emitted from the second light-emitting element 22 to the outside from the second covering member 32 is facilitated. The light extraction efficiency of the light-emitting device 1000 is thus improved. In the present embodiment, the expression "the area of the second covering member 32" in the first cross section refers to the total of the area of the base material 320B and the area of the second reflective particles 320A constituting the second covering member 32.

In the first cross section, the ratio of the area of the second reflective particles 320A to the area of the second covering member 32 is higher than the ratio of the area of the first reflective particles 310A to the area of the first light-transmissive portion 311B. In the first cross section, the ratio of the area of the second reflective particles 320A to the area of the second covering member 32 is preferably five times or more as large as the ratio of the area of the first reflective particles 310A to the area of the first light-transmissive portion 311B. This constitution facilitates diffusion of light emitted from the upper surface of the first light-emitting element 21 and light emitted from the upper surface of the second light-emitting element 22 in the second covering member 32.

The second covering member 32 is preferably in contact with the upper surface of the first light-emitting element 21 and the upper surface of the second light-emitting element 22. This constitution facilitates guiding of light emitted from the first light-emitting element 21 and light emitted from the second light-emitting element 22 into a second covering member 32. Improvement of the light extraction efficiency of the light-emitting device 1000 is thus facilitated. The second covering member 32 is preferably in contact with the upper surface of the third light-emitting element 23. The second covering member 32 is preferably in contact with the first light-transmissive portion 311B of the first covering member. This constitution facilitates guiding of light emitted from the first light-emitting element 21 and light emitted from the second light-emitting element 22 from the first covering member 31 into the second covering member 32. The second covering member 32 is preferably in contact with the second light-transmissive portion 312B and the third light-transmissive portion 313B.

As shown in FIG. 5, in the first direction (X direction), a portion of the second covering member 32 preferably overlaps the first light-emitting element 21 and the second light-emitting element 22. This constitution facilitates increase of the length of the portion of the second covering member 32 located between the first light-emitting element 21 and the second light-emitting element 22 in the third direction (Z direction). Diffusion of light emitted from the first light-emitting element 21 and light emitted from the second light-emitting element 22 by the second covering member 32 is thus facilitated, so that it becomes easy to prevent the emission surface located between the first light-emitting element 21 and the second light-emitting element 22 from being too bright.

As shown in FIG. 5, the first light-transmissive portion second height TH12 is less than the first light-transmissive portion first height TH11. This constitution facilitates increase of the length of the portion of the second covering member 32 located outward of the first light-emitting element 21 in the third direction (Z direction). It thus becomes easy for the second covering member 32 to diffuse light emitted from the lateral surfaces of the first light-emitting element not facing the second light-emitting element, so that improvement of the color mixing properties of the light-emitting device 1000 is facilitated.

The second covering member 32 may contain a phosphor. If the second covering member 32 contains a phosphor, adjustment of the chromaticity of the light-emitting device is facilitated. Examples of the phosphor include yttrium-aluminum-garnet based phosphors (such as $(Y,Gd)_3(Al,Ga)_5O_{12}$:Ce), lutetium-aluminum-garnet based phosphors (such as $Lu_3(Al,Ga)_5O_{12}$:Ce), terbium-aluminum-garnet based phosphors (such as $Tb_3(Al,Ga)_5O_{12}$:Ce), CCA based phosphors (such as $Ca_{10}(PO_4)_6C_{12}$:Eu), SAE based phosphors (such as $Sr_4Al_{14}O_{25}$:Eu), chlorosilicate based phosphors (such as $Ca_8MgSi_4O_{16}C_{12}$:Eu), silicate based phosphors (such as $(Ba,Sr,Ca,Mg)_2SiO_4$:Eu), oxynitride based phosphors such as β-SiAlON based phosphors (such as $(Si,Al)_3(O,N)_4$:Eu) and α-SiAlON based phosphors (such as $Ca(Si,Al)_{12}(O,N)_{16}$:Eu), nitride based phosphors such as LSN based phosphors (such as $(La,Y)_3Si_6N_{11}$:Ce), BSESN based phosphors (such as $(Ba,Sr)_2Si_5N_8$:Eu), SLA based phosphors (such as $SrLiAl_3N_4$:Eu), CASN based phosphors (such as $CaAlSiN_3$:Eu), and SCASN based phosphors (such as $(Sr,Ca)AlSiN_3$:Eu), fluoride based phosphors such as KSF based phosphors (such as $K_2SiF_6$:Mn), KSAF based phosphors (such as $K_2(Si_{1-x}Al_x)F_6$-x:Mn, where x satisfies $0<x<1$), and MGF based phosphors (such as $3.5MgO·0.5MgF_2·GeO_2$:Mn), quantum dots having the perovskite structure (such as $(Cs,FA,MA)(Pb,Sn)(F,Cl,Br,I)_3$, where FA and MA respectively represent formamidinium and methylammonium), group II-VI quantum dots (such as CdSe), group III-V quantum dots (such as InP), and quantum dots having the chalcopyrite structure (such as $(Ag,Cu)(In,Ga)(S,Se)_2$). For the phosphor added to the second covering member 32, a single type of phosphor or a plurality of types of phosphors may be used.

Protective Element 40

The light-emitting device 1000 may include a protective element 40 to improve the electrostatic discharge withstand voltage. Various protective elements installed in common light-emitting devices can be used for the protective element. For example, a Zener diode can be used for the protective element. One protective element may be used, or a plurality of protective elements may be used. The light-emitting device 1000 includes a plurality of protective elements 40 including a first protective element 41, a second protective element 42, and a third protective element 43. In the light-emitting device 1000, conductive paths for the respective light-emitting elements are separated from one another, and the electrostatic discharge withstand voltage of the light-emitting device 1000 can be further improved by providing one protective element for each light-emitting element. For example, the first protective element 41 is preferably connected in parallel to the first light-emitting element 21, the second protective element 42 is preferably connected in parallel to the second light-emitting element 22, and the third protective element 43 is preferably connected in parallel to the third light-emitting element 23.

Light-Reflective Member 50

The light-emitting device 1000 may include the light-reflective member 50 covering the first surface 101 of the support 10. The light-reflective member 50 reflects light emitted from the light-emitting elements 20. If the light-emitting device 1000 includes the light-reflective member 50, absorption of light emitted from the light-emitting elements 20 into the support can be reduced. The light extraction efficiency of the light-emitting device is thus improved. In the present specification, the term "reflective" means that the reflectance at the peak wavelength of the light-emitting element is 50% or more. In the case in which the light-emitting device includes a plurality of light-emitting elements, it is sufficient that the reflectance at the peak wavelength of at least one light-emitting element is 50% or more.

For example, the light-reflective member 50 includes a resin material to serve as a base material and a light-reflective substance. The same resin material as in the resin molded body 13 can be used for the resin material of the light-reflective member 50. The same light-reflective substance as in the resin molded body 13 can be used for the light-reflective substance of the light-reflective member 50.

The light-reflective member 50 may be in contact with or spaced apart from the light-emitting elements 20. If the light-reflective member 50 is in contact with the light-emitting elements 20, the area in which the light-reflective member 50 covers the first surface of the support is easily increased. Reduction of absorption of light emitted from the light-emitting elements into the support is thus facilitated. If the light-reflective member 50 is spaced apart from the light-emitting elements 20, extraction of light emitted from the lateral surfaces of the light-emitting elements 20 is facilitated.

Figure 12:
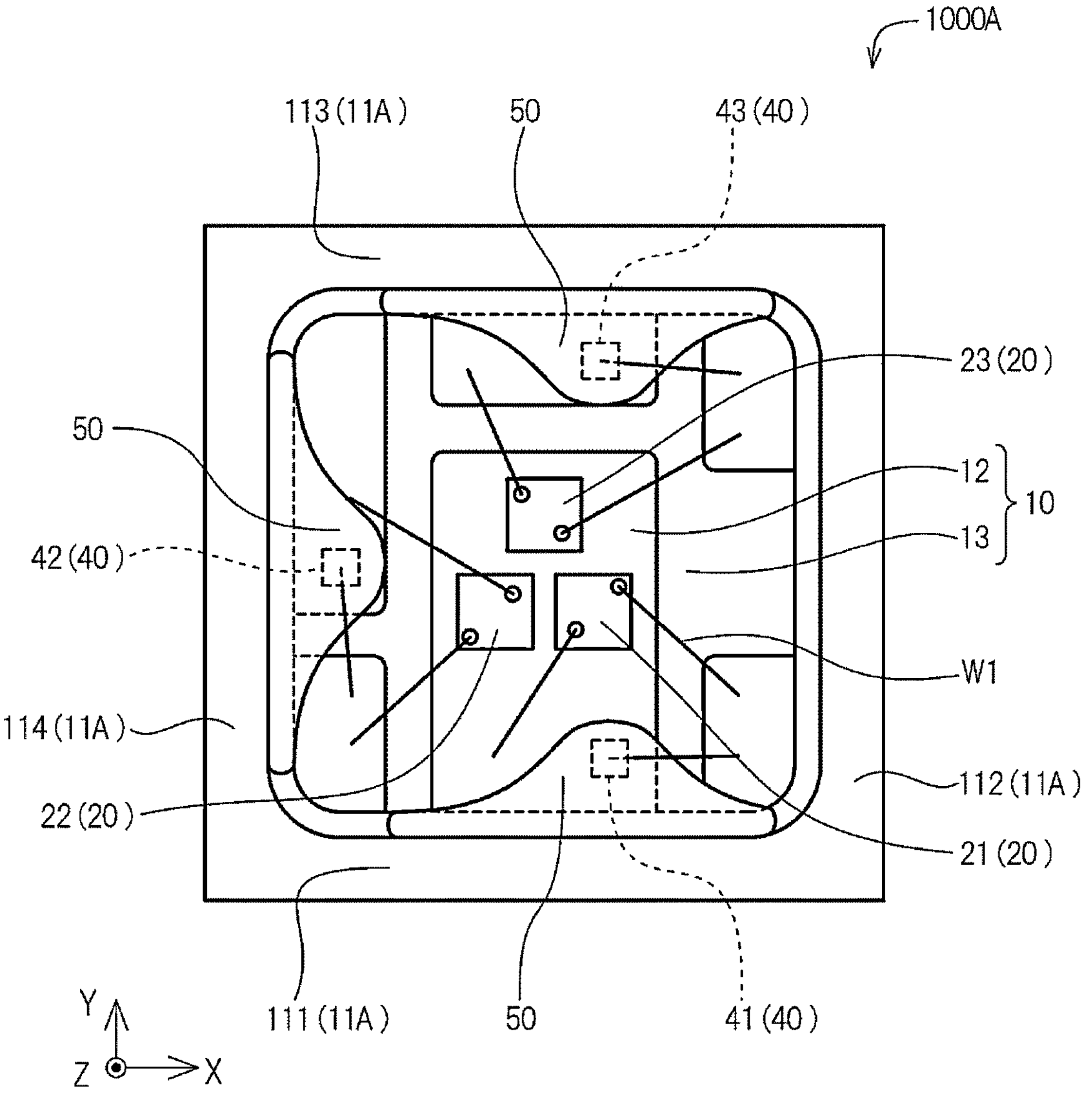
FIG. 12 is a schematic top view of a modified example of the light-emitting device according to the present embodiment.

One light-reflective member 50 may surround the whole circumference of the light-emitting elements 20 as in the light-emitting device 1000 in FIG. 1, or a plurality of light-reflective members 50 may surround the light-emitting elements 20 as in a light-emitting device 1000A in FIG. 12. If one light-reflective member 50 surrounds the whole circumference of the light-emitting elements 20, the area in which the light-reflective member 50 covers the first surface of the support is easily increased. Reduction of absorption of light emitted from the light-emitting elements 20 into the support 10 is thus facilitated. If a plurality of light-reflective members 50 surround the light-emitting elements, reduction of the volume of each light-reflective member 50 is facilitated. Reduction of variations of the shape of each light-reflective member 50 is thus facilitated, so that improvement of the yield of the light-emitting device is facilitated. In the case in which the light-emitting device 1000 includes the protective elements 40, at least a portion of the protective elements 40 is preferably covered with the light-reflective member 50 as shown in FIG. 1 and FIG. 12. Reduction of absorption of light emitted from the light-emitting elements 20 into the protective elements 40 is thus facilitated.

The embodiment of the present invention has been described above referring to specific examples. However, the present invention is not limited to these specific examples. All embodiments that can be made by a person skilled in the art by appropriately changing the configuration of the embodiment of the present invention described above are within the scope of the present invention as long as the gist of the present invention is included. A person skilled in the art can think of other various changes and modifications within the idea of the present invention, and such changes and modifications are also within the scope of the present invention.

The invention claimed is:

1. A light-emitting device comprising:

a support having a first surface;

a first light-emitting element located on the first surface and configured to emit light with a first peak wavelength;

a second light-emitting element located on the first surface and configured to emit light with a second peak wavelength different from the first peak wavelength;

a first covering member exposing at least a portion of an upper surface of the first light-emitting element and at least a portion of an upper surface of the second light-emitting element, covering at least a portion of a lateral surface of the first light-emitting element and at least a portion of a lateral surface of the second light-emitting element, and containing a plurality of first reflective particles; and a second covering member covering at least a portion of the upper surface of the first light-emitting element and at least a portion of the upper surface of the second light-emitting element and containing a plurality of second reflective particles, wherein the first covering member includes a first reflective portion and a first light-transmissive portion above the first reflective portion in a first cross section passing through the first light-emitting element and the second light-emitting element and lying in a plane perpendicular to the first surface, a ratio of an area of the plurality of first reflective particles to an area of the first reflective portion is higher than a ratio of an area of the plurality of second reflective particles to an area of the second covering member in the first cross section, a ratio of the area of the plurality of first reflective particles to an area of the first light-transmissive portion is lower than the ratio of the area of the plurality of second reflective particles to the area of the second covering member in the first cross section, and a minimum height of the first light-transmissive portion located between the first light-emitting element and the second light-emitting element is greater than a minimum height of the first light-transmissive portion located outward of the first light-emitting element in the first cross section.

2. The light-emitting device according to claim 1, further comprising a third light-emitting element located on the first surface and configured to emit light with a third peak wavelength different from the first peak wavelength and the second peak wavelength, wherein the first light-emitting element and the second light-emitting element are aligned in a first direction in a top view, and the third light-emitting element overlaps at least a portion of the first light-emitting element and at least a portion of the second light-emitting element in a second direction orthogonal to the first direction in the top view.

3. The light-emitting device according to claim 2, wherein the first covering member includes a second reflective portion and a second light-transmissive portion above the second reflective portion in a second cross section passing through the first light-emitting element and the third light-emitting element and lying in a plane perpendicular to the first surface, a ratio of an area of the plurality of first reflective particles to an area of the second reflective portion is higher than a ratio of an area of the plurality of second reflective particles to an area of the second covering member in the second cross section, a ratio of the area of the plurality of first reflective particles to an area of the second light-transmissive portion is lower than the ratio of the area of the plurality of second reflective particles to the area of the second covering member in the second cross section, and a minimum height of the second light-transmissive portion located between the first light-emitting element and the second light-emitting element is greater than a minimum height of the second light-transmissive portion located outward of the first light-emitting element in the second cross section.

4. The light-emitting device according to claim 2, wherein a maximum height of the third light-emitting element is greater than a maximum height of the first light-emitting element.

5. The light-emitting device according to claim 1, wherein the first light-transmissive portion does not contain the plurality of first reflective particles.

6. The light-emitting device according to claim 2, wherein the first covering member includes a third reflective portion and a third light-transmissive portion above the third reflective portion in a third cross section passing through the third light-emitting element and a region between the first light-emitting element and the second light-emitting element and lying in a plane perpendicular to the first surface, a ratio of an area of the plurality of first reflective particles to an area of the third reflective portion is higher than a ratio of an area of the plurality of second reflective particles to an area of the second covering member in the second cross section, and a ratio of the area of the plurality of first reflective particles to an area of the third light-transmissive portion is lower than the ratio of the area of the plurality of second reflective particles to the area of the second covering member in the second cross section.

7. The light-emitting device according to claim 6, wherein in the third cross section, a height of a first region of the third light-transmissive portion that overlaps the first light-emitting element in the first direction and is located closest to the third light-emitting element is greater than a height of a second region of the third light-transmissive portion that overlaps the first light-emitting element 21 in the first direction and is located farthest from the third light-emitting element.

8. The light-emitting device according to claim 1, further comprising a light reflective-member covering the first surface of the support, and at least partially surrounding the first light-emitting element and the second light-emitting element in a top view.

* * * * *